United States Patent [19]

Atsumi

[11] Patent Number: 4,654,543
[45] Date of Patent: Mar. 31, 1987

[54] THYRISTOR WITH "ON" PROTECTIVE CIRCUIT AND DARLINGTON OUTPUT STAGE

[75] Inventor: Masaharu Atsumi, Kawasaki, Japan

[73] Assignee: Fujitsu Limited, Kawasaki, Japan

[21] Appl. No.: 681,087

[22] Filed: Dec. 13, 1984

Related U.S. Application Data

[63] Continuation of Ser. No. 325,581, Nov. 30, 1981, abandoned, which is a continuation of Ser. No. 121,000, Feb. 13, 1980, abandoned.

[30] Foreign Application Priority Data

Feb. 16, 1979 [JP] Japan ................................. 54-16002

[51] Int. Cl.$^4$ ............................................ H03K 17/60
[52] U.S. Cl. ................................ 307/252 A; 307/305; 357/38; 357/51
[58] Field of Search ............... 357/51, 38; 307/252 A, 307/252 C, 5 N, 305

[56] References Cited

U.S. PATENT DOCUMENTS 3,549,909 12/1970 Adelson et al. ................. 307/252 A
3,846,648 11/1974 Scott ............................... 307/252 N
4,015,143 3/1977 Tokunaga et al. ............. 307/252 N
4,112,315 9/1978 Ohhinata .......................... 307/252 J
4,125,787 11/1978 Ohhinata et al. ................ 307/252 A Primary Examiner—Joseph E. Clawson, Jr.
Attorney, Agent, or Firm—Staas & Halsey

[57] ABSTRACT

A thyristor is preferably fabricated as a single thyristor device in an integrated circuit. The thyristor is made conductive by applying an ordinary gating voltage to the gate thereof. However, the thyristor can be kept in a conductive state, even though a current flowing through the anode and cathode thereof is stopped, if the current is restored to flow through it again within a predetermined short time after has stopped. The thyristor is composed of a first transistor and a second transistor (both of which are also used in a typical thyristor component) a third transistor which forms a Darlington connection with the second transistor, a resistor which is connected between the base and the emitter of the third transistor, and a capacitor which is connected between the base of the second transistor and the emitter of the third transistor.

9 Claims, 7 Drawing Figures

THYRISTOR WITH "ON" PROTECTIVE CIRCUIT AND DARLINGTON OUTPUT STAGE

This is a continuation of co-pending application Ser. No. 325,581, filed on Nov. 30, 1981, which was a continuation of co-pending application Ser. No. 121,000, filed on Feb. 13, 1980, both now abandoned.

BACKGROUND OF THE INVENTION

1. Field of the Invention

The present invention relates to a thyristor, and more particularly relates to an SCR (silicon-controlled rectifier) which is preferably formed as an SCR element in an integrated circuit (IC).

2. Description of the Prior Art

As is widely known, the thyristor is a three-electrode semiconductor device provided with a gate, a cathode and an anode. Once a gating voltage having a predetermined level is applied to the gate of the thyristor, the path between the anode and cathode becomes conductive and remains in a conductive state without further application of the gating voltage. On the other hand, during said conductive state of the thyristor, once the path between the anode and cathode thereof is caused to become non-conductive, the thyristor ceases to conduct and remains in a non-conductive state unless the gating voltage is applied again to the gate.

The above mentioned typical operation of the thyristor is a widely known characteristic function of the thyristor. Many kinds of apparatuses have been proposed and put into practice, which operate by utilizing this characteristic function of thyristor. However, in some apparatuses which utilize the thyristors, it is not always convenient to utilize this characteristic function of the thyristor. For example, in an apparatus which contains a load to be driven or not driven under control of the thyristor, it is preferable not to utilize this original characteristic function of the thyristor, as the load itself is liable to become conductive or non-conductive. In this case, although it is necessary to supply a driving current continuously to the load by way of the thyristor, if once the driving current is stopped from flowing through the load due to the occurrence of a non-conductive state of the load itself, the driving current will not flow through the load and, therefore, will be stopped from flowing through the thyristor. This is because, as previously mentioned, once the driving current is stopped from flowing through the load and also the thyristor, the thyristor will not be conductive and will be in a non-conductive state, unless the gating voltage is applied again to the gate of the thyristor, even though the load itself may be restored to a conductive state. Accordingly, in such an apparatus, it is necessary for the thyristor to become conductive when a predetermined gating voltage is applied to the gate thereof, in the usual manner, and further it is also necessary for the thyristor to remain in said conductive state even though the driving current is momentarily interrupted by an instantaneous non-conductive state created by the load itself. Thus, the thyristor can be kept in a conductive state, even though the driving current momentarily stops flowing through the thyristor.

It may be possible to create such a thyristor, which can be kept in a conductive state, even though the driving current is momentarily interrupted, by combining a typical thyristor component which is commonly available with an additional control circuit which cooperates with the typical thyristor. However, a thyristor which is capable of being kept in a conductive state, but which is not a combination as stated above, has not heretofore been known in the art; such a single thyristor device, formed as a part of an integrated circuit or as a single chip thyristor, would be very desirable. It should be noted that construction of such a thyristor, as a single thyristor device would be very different from the construction of a thyristor which is composed of both the typical thyristor component and the additional control circuit.

SUMMARY OF THE INVENTION

Therefore, it is an object of the present invention to provide a thyristor wich can remain in a conductive state, even though the driving current momentarily stops flowing therethrough, and which is formed as a single thyristor device in an integrated circuit.

BRIEF DESCRIPTION OF THE DRAWINGS

The present invention will be more apparent from the ensuing description with reference to the accompanying drawings wherein.

DETAILED DESCRIPTION OF PREFERRED EMBODIMENTS

Figure 1:
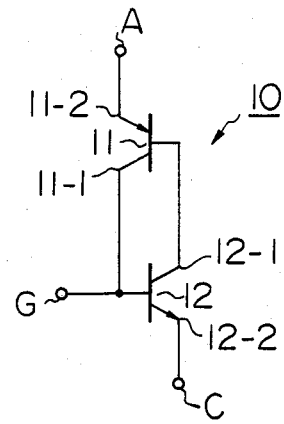
FIG. 1 shows an equivalent circuit diagram of a typical thyristor.

In FIG. 1, which shows an equivalent circuit diagram of a typical thyristor, the reference symbols A, C and G represent, respectively, an anode, a cathode and a gate of a thyristor 10. The thyristor 10 is comprised of a first transistor 11 and a second transistor 12. A second terminal 11-2 of the first transistor 11 is connected to the anode A, and a second terminal 12-2 of the second transistor 12 is connected to the cathode C. A first terminal 11-1 of the first transistor 11 and the base of the second transistor 12 are connected in common to the gate G. The base of the first transistor 11 and the first terminal 12-1 of the second transistor 12 are connected to each other. When a predetermined gating voltage is applied to the gate G, the second transistor 12 is caused to be conductive, then the first transistor 11 is caused to be conductive. Then, the path between the anode A and the cathode C becomes conductive. Thereafter, the thyristor 10 remains in a conductive state without further application of the gating voltage to the gate G. However, once the current flowing through the anode A and the cathode C is stopped, both transistors 11 and 12 suddenly become non-conductive and remain in a non-conductive state unless the gating voltage is applied again to the gate G. In this case, it should be noted that, even if the current flowing through the anode A and the cathode C is interruped for only an extremely short time, the thyristor 10 is suddenly changed from a conductive state to a non-conductive state. Accordingly, as previously mentioned, it is not always convenient for some applications to utilize only the above mentioned characteristic function of the typical thyristor.

Figure 2:
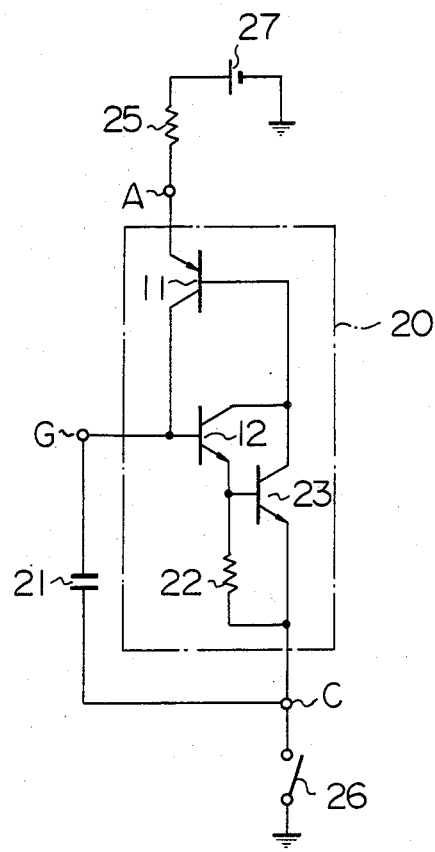
FIG. 2 illustrates an equivalent circuit diagram of a first example of a thyristor according to the present invention.

Therefore, the present invention provides a thyristor, modified from the typical thyristor, and which can be formed as a single thyristor device in an integrated circuit. Then thyristor of the present invention has a characteristic function such that, even though if the current flowing through the anode A and the cathode C is interrupted momentarily, the current can and continue to flow if the current is restored to flow within a predetermined short duration of time after the current has first been stopped. In FIG. 2, which illustrates an equivalent circuit diagram of a first example of a thyristor according to the present invention, the reference numeral 20 represents the thyristor according to the present invention. In FIG. 2, the members which are represented by the same reference numerals or symbols as shown in FIG. 1, are identical members. Therefore, a capacitor 21, a resistor 22 and a third transistor 23 are newly employed members according to the present invention.

The operation of the thyristor 20 will now be explained. When a gating voltage having a predetermined level is applied to the gate G, the second transistor 12 and then the first transistor 11 become conductive, as occurs in the typical thyristor 10 shown in FIG. 1. Thus, the thyristor 20 is now in a conductive state. In this case, one of the advantages of the present invention resides in that the predetermined level of the gating voltage to be applied to the gate G of the thyristor 20 is not higher than lower than that of the typical thyristor 10; that is, the gating voltage level of the thyristor 20 is substantially the same as that of the typical thyristor 10, which fact may be understood from the following. When a predetermined gating voltage $V_{G1}$ is applied to the gate G and an emitter current $I_{E2}$ flows through the emitter of the second transistor 12, the following equation (1) is obtained $$V_{G1} = V_{BE2} + R \cdot I_{E2} \qquad (1)$$

where the symbol $V_{BE2}$ denotes the base-emitter voltage of the second transistor 12 when transistor 12 is conductive and the symbol R denotes the resistance value of the resistor 22. In the above equation (1), the magnitude of the current $I_{E2}$ is initially very small. This is because when the second transistor 12 begins to be turned on by the gating voltage $V_{G1}$, the first transistor 11 is not yet fully turned on. Thus, since the magnitude of the current $I_{E2}$ is initially very small, the following inequality (2) is obtained.

$$V_{BE2} >> R \cdot I_{E2} \qquad (2)$$

consequently, the above equation (1) may be transformed to the following approximation equation (3), by taking the above inequality (2) into consideration.

$$V_{G1} \simeq V_{BE2} \qquad (3)$$

As may be understood from the equation (3), level of the gating voltage $V_{G1}$ of the thyristor 20 is almost equal to the level $V_{BE2}$ which is generally about 0.7 V. Therefore, the level of the gating voltage of the thyristor 20 is substantially the same as that of the typical thyristor 10.

Another of the advantages according to the present invention is as follows. When the second transistor 12 is caused to be conductive and then the first transistor 11 is also caused to be conductive, the magnitude of said emitter current $I_{E2}$ increases very quickly. Then the third transistor 23 is also caused to be conductive due to the large emitter current $I_{E2}$. At the same time, the capacitor 21 is charged toward a charging voltage $V_{G2}$. This charging voltage $V_{G2}$ is expressed by the following equation (4).

$$V_{G2} = V_{BE2} + V_{BE3} \qquad (4)$$

where the reference symbol $V_{BE3}$ denotes a base-emitter voltage of the third transistor 23 when transistor 23 is conductive. This voltage $V_{G2}$ corresponds to an equivalent gating voltage during the conductive state of the thyristor 20.

Figure 3:
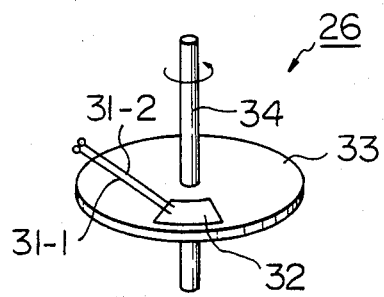
FIG. 3 is a perspective view of an example of the switch element 26 shown in FIG. 2.

Details of the characteristic function of the thyristor 20 are explained by taking, for example, a case where a driving current of a load is stopped from flowing through the thyristor 20 during the conductive state thereof. The load is schematically illustrated, in FIG. 2, by a resistor 25 and a switching element 26. The reference numeral 27 represents a power source which supplies the driving current to the load (25, 26) via the thyristor 20. Specifically, said switching element 26 may be constituted by a sliding contact switch and said resistor 25 represents, for example, an electric motor. When said sliding contact switch (26) is actuated, the switch is liable to be non-conductive momentarily, due to the occurrence of a so-called chattering induced between the two switch contacts. If the chattering occurs at the switch 26, the cathode C is set in an electrically floating condition. Thus, if the thyristor is not the thyristor 20, but instead the typical thyristor 10 of FIG. 1, the motor (25) would suddenly stop rotating even though the switch 26 is closed again. One example of the sliding contact switch (26) is illustrated in FIG. 3, which is a perspective view of an example of the switch (26). In FIG. 3, the sliding contact switch (26) comprises a pair of brushes (contacts) 31-1 and 31-2, a conductive metal layer 32, and an insulation disc 33. The disc 33 is mechanically supported by an axle 34 and is rotated thereby. When the brushes 31-1 and 31-2 slide on the insulation disc 33, the switch element 26 is open, while, when the brushes 31-1 and 31-2 slide on the conductive metal layer 32, the switch element 26 is closed. However, while the brushes 31-1 and 31-2 are sliding on the layer 32, and accordingly the switch element 26 is closed, the switch element 26 is liable to be opened momentarily due to the chattering occurring between the brushes 31-1, 31-2 and the layer 32. Thus, the motor (25) suddenly stops rotating even though the brushes are sliding on the layer 32. For the purpose of eliminating the mechanical chattering with the aid of electrical means, the thyristor 20 of FIG. 2 is very useful.

In the thyristor 20 of FIG. 2, the gating voltage thereof is not $V_{G1}$ but $V_{G2}$ (refer to the above recited equations (3) and (4)), when the thyristor 20 is kept in the conductive state. Since the level of $V_{G2}$ is higher than the level of $V_{G1}$, the second transistor 12 of the thyristor 20 can remain in the conductive state while during the time when the gating voltage decreases from $V_{G2}$ to $V_{G1}$ due to the discharge of the capacitor 21.

Therefore, if the switch element 26 is restored to a conductive state again before the gating voltage has decreased from $V_{G2}$ to $V_{G1}$, the normal circuit condition for supplying the current for the motor (25) is restored. The time t, during which the gating voltage decreases from $V_{G2}$ to $V_{G1}$, is determined by the time constant which is defined by the capacitance value C of the capacitor 21 and the resistance value R of the resistor 22, that is t=CR. It is, of course, known that the duration t can be varied by suitably selecting one of the values C and/or R.

Generally, the above mentioned chattering occurs when the duration of time is on the order of about several tens of ms, and the capacitance value C is on the order of several μF. However, when the thyristor 20 of FIG. 2 is fabricated as an integrated circuit, it is impossible for a capacitor to have a capacitance value of several μF in the integrated circuit. Generally, an integrated circuit can accommodate a capacitor having a capacitance value of several pF at most. This is the reason why, in FIG. 2, the capacitor 21 is employed as an external capacitor component to be connected between the terminals (G and C). Therefore, the capacitor 21 can be made a variable capacitor, if necessary.

As previously mentioned, it is preferable to fabricate the thyristor 20 not as the typical thyristor component which is available, but as a single thyristor device formed in an integrated semiconductor circuit. The reason for this is as follows. If the thyristor 20 is formed by using the typical thyristor component, such as the thyristor 10 of FIG. 1, it is impossible to introduce the resistor 22 and the third transistor 23 (both shown in FIG. 2) into the typical thyristor 10. This is because the thyristor 10 has no terminals suitable for introducing such resistor 22 and transistor 23 therein. However, if the thyristor is formed as a part of an integrated circuit, it is very easy to include the resistor 22 and the transistor 23 on the same semiconductor substrate.

Figure 4:
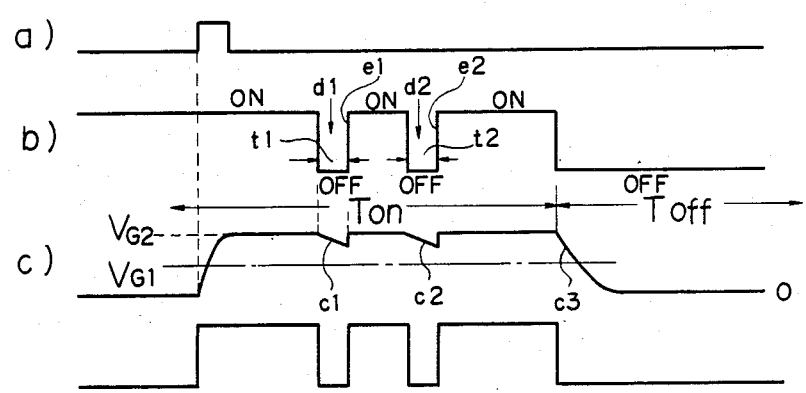
FIG. 4 depicts waveforms of signals appearing in the thyristor 20 shown in FIG. 2.

The characteristic function of the thyristor 20, shown in FIG. 2, is demonstrated with reference to FIG. 4, which depicts waveforms of signals appearing in the thyristor 20. In FIG. 4, (row a) depicts the waveform of a gating pulse to be applied to the gate G, (row b) schematically indicates the conductive state (ON) and the non-conductive state (OFF) of the switching element 26, (row c) depicts the waveform of terminal voltage developed across the capacitor 21 and (row d) depicts the waveform of the driving current flowing through the thyristor 20 and also the motor (25) and the switching element 26. When the gating pulse is fed to the gate G of the thyristor 20 (see row a)) while the switching element 26 is conductive (ON) (see row b)), the transistors 11, 12 and 23 become conductive. Then the terminal voltage developed across the capacitor 21 increases from zero to the voltage $V_{G2}$ (refer to the above recited equation (4) and (FIG. 2, row c)). Simultaneously, the driving current is fed to the motor (25) via the thyristor 20 (see row d)). In (row b), the reference symbols $T_{on}$ and $T_{off}$ respectively indicate the time when the brushes 31-1 and 31-2 slide on the conductive metal layer 32 (both shown in FIG. 3) and the time when the brushes slide on the insulation disc 33. During the time $T_{on}$, instantaneous OFFs represented by d1 and d2 occur due to the presence of the aforementioned chattering. If the thyristor were a typical thyristor, the thyristor would become non-conductive and the driving current would cease to flow unless the gating pulse were applied to the gate G again. However, if the thyristor is the thyristor 20, the driving current can resume when the switching element 26 becomes conductive (ON) again (see rising edges e1 and e2 in row b)). In this case, the duration of times t1 and t2 must be shorter than the aforesaid time-constant t which is defined by C.R. If the times t1 and t2 are longer than the time constant t, the terminal voltages c1 and c2 of the capacitor 21 would decrease and reach the voltage $V_{G1}$ due to the discharge of the capacitor 21. After the duration of time t3, the capacitor terminal voltage c3 has reached voltage $V_{G1}$ and gone under the voltage $V_{G1}$; thereby, the thyristor 20 cannot be conductive, unless the gating pulse is applied to the gate G again.

Figure 5:
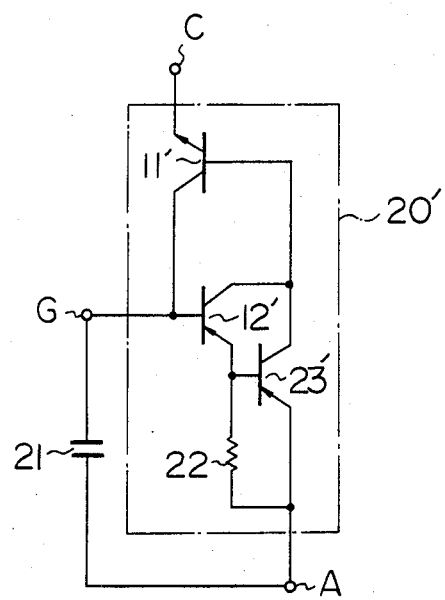
FIG. 5 illustrates an equivalent circuit diagram of a second example of a thyristor, according to the present invention.

The thyristor 20 of FIG. 2 is comprised of the pnp transistor 11, the npn transistor 12 and the npn transistor 23. However, the thyristor can be comprised of transistors which have opposite conductivity types of transistors. FIG. 5, where a thyristor 20' is comprised of an npn transistor 11', illustrates an equivalent circuit diagram of a second example of the thyristor according to the present invention. In FIG. 5, a thyristor 20' is comprised of an npn transistor 11', a pnp transistor 12' and a pnp transistor 23'. The operation of the thyristor 20' is substantially the same as that of the thyristor 20, except that the gating voltage is a negative voltage.

Figure 6A:
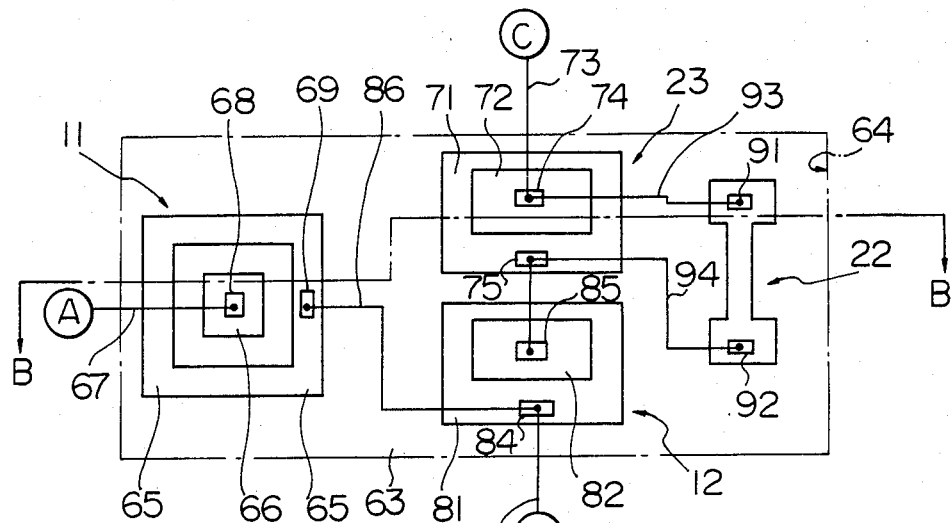
FIG. 6A is an actual plan view of the thyristor 20, fabricated as an integrated circuit, as shown in FIG. 2.
Figure 6B:
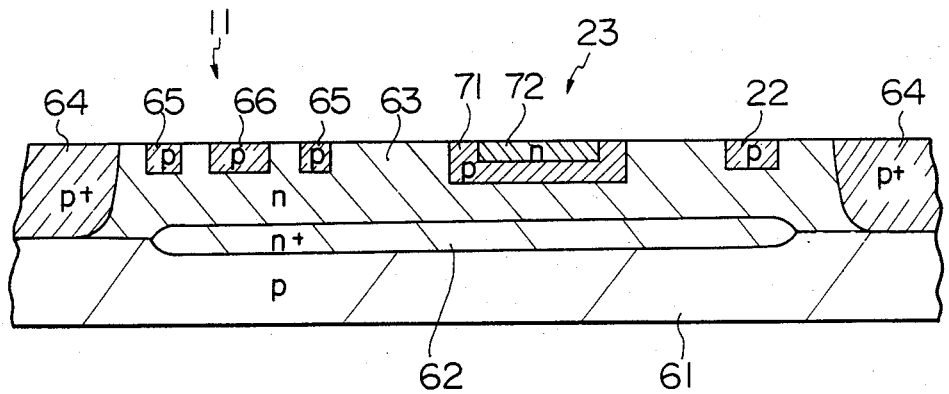
FIG. 6B is a cross-sectional view taken along the line B—B in FIG. 6A.

As previously mentioned, the thyristor 20 is preferably fabricated as a single thyristor device in the integrated circuit. FIG. 6A illustrates an actual plan view of the thyristor 20, fabricated as an integrated circuit. FIG. 6B is a cross-sectional view taken along the line B—B in FIG. 6A. In both FIGS. 6A and 6B, the areas 11, 12, 23 and 22 correspond to the first transistor, the second transistor, the third transistor and the resistor, respectively, which are all shown in FIG. 2. The capacitor 21 of FIG. 2 is not shown in FIGS. 6A and 6B. The reference symbols A, C and G, indicate respectively, the anode, the cathode and the gate of the thyristor. These members are mounted on a P-type substrate 61 above an n+-type buried layer 62. An n-type region 63 is formed above the layers 61 and 62. The region 63 is enclosed by a p+-type isolation region 64. The region 63 and the region 64 are exposed on the surface of the integrated semiconductor device. Regions 63, 65, and 66 are, respectively, the base, collector, and emitter of the first transistor 11. A line 67 (only shown in FIG. 6A) is a lead connected, at one end, to the anode A and, at the other end, to an emitter contact 68 (only shown in FIG. 6A). Regions 63, 71 and 72 are, respectively, collector, base and emitter of the third transistor 23. A line 73 (only shown in FIG. 6A) is a lead connected, at one end, to the cathode C and, at the other end, to an emitter contact 74 (only shown in FIG. 6A). Regions 63, 81 and 82 are, respectively, the collector, base and emitter of the second transistor 12. A line 83 is a lead connected, at one end, to the gate G and, at the other end, to a base contact 84. It should be noted that the region 63 is a common region to the transistors 11, 12 and 23. The resistor 22 is connected, at one end via a contact 91, to the emitter contact 74 of the third transistor 23, and, at the other end via a contact 92, to a base contact 75, through lines 93 and 94, respectively. The base contact 75 of the transistor 23 is also connected to an emitter contact 85 of the second transistor 12. The base contact 84 of the transistor 12 is connected to a collector contact of transistor 11 via a line 86.

The regions 65 and 66 of the transistor 11 are p-type diffusion regions. The region 71 of the transistor 23 is also a p-type diffusion region. Further the resistor 22 can also be made of a p-type diffusion region. The region 72 is an n-type diffusion region. Since the p-type resistor 22 is reverse biased with respect to the n-type region 63, the resistor 22 has no bad electric effect on the other regions. Thus, all the elements are formed on the same semiconductor substrate, as one body, and accordingly, a single thyristor device (20) can be created.

As explained above in detail, this unique thyristor can be realized without enlarging the chip size of the typical thyristor. This unique thyristor is not sensitive to instantaneous interruptions of current flowing therethrough. Accordingly, this unique thyristor is very useful for a thyristor which is utilized as a switching device for a load which is liable to momentary interruption of from flowing the driving current by the load itself.

What is claimed is:

1. A circuit including an anode, a cathode and a gate, said circuit connected to a power supply and ground via the anode and the cathode, said circuit comprising:
   a first transistor comprising a base, a first terminal connected to said gate, and second terminal connected to a selected one of said anode and said cathode;
   a second transistor comprising a first terminal connected to the base of the first transistor, a second terminal, and a base connected to the gate;
   a third transistor having a first terminal connected to the first terminal of said second transistor, a second terminal connected to the other of said anode and said cathode, and a base connected to the second terminal of said second transistor;
   a resistor, having a first end connected to the second terminal of said third transistor and a second end connected to the second terminal of said second transistor and the base of said third transistor to form a common node therewith, the common node being exclusively connected to said resistor and said second and third transistors; and
   a capacitor connected between said gate and the other of said anode and said cathode;
   said second transistor being responsive to a gating voltage applied to said gate with respect to ground, said second transistor thereby being rendered conductive and, during initial turn-on of said first transistor as a result of conduction of said second transistor, establishing the following voltage relationship:

$$V_{G1} = V_{BE2} + R \cdot I_{E2} \approx V_{BE2}$$

where $V_{G1}$ is a gate voltage applied to said gate, $V_{BE2}$ is a voltage difference between the base and the second terminal of said second transistor, R is a resistance value of said resistor and $I_{E2}$ is a current passing through the second terminal of said second transistor during initial turn-on of said first transistor and, when said first transistor is substantially turned on and thereby said third transistor as well is caused to be substantially fully conductive, the following voltage relationships exist:

$$V_{G2} = V_{BE2} + V_{BE3}$$

where $V_{BE3}$ is a voltage difference between the base and the second terminal of said third transistor and $V_{G2}$ is a voltage to which said capacitor is charged and which functions as an equivalent gate voltage during the conductive state of all three said transistors.

2. The circuit of claim 1, the first transistor comprising a pnp transistor and the second and third transistors comprising npn transistors.

3. The circuit of claim 1, the first transistor comprising an npn transistor and the second and third transistors comprising pnp transistors.

4. The circuit of claim 1, comprising an integrated semiconductor circuit including said first, second and third transistors on a single chip.

5. The circuit of claim 4, said single chip semiconductor circuit further including said resistor therein.

6. The circuit of claim 4, said capacitor being a discrete element independent of said single chip.

7. The circuit of claim 6, said capacitor comprising a variable capacitor.

8. The circuit of claim 1 for use in series circuit with a switching element, a load and a power supply, wherein:
   said three transistors function as a switching device responsive to a signal of a first voltage level applied to said gate terminal to switch from an off to an on state, and said capacitor is charged during said on state for maintaining a higher turn-on voltage level on said gate than said first voltage level for a time interval determined in accordance with a discharge rate period defined by said resistor and said capacitor,
   said switching element being subject to chattering and thereby interrupting the supply of power to said load from said power supply for corresponding, intermittent time periods, and
   said resistor and capacitor being selected to define a time interval of discharge from said higher to said first voltage level which exceeds any such intermittent time period.

9. A circuit including an anode, a cathode and gate, said circuit connected to a power supply and ground via the anode and the cathode, said circuit comprising:
   a first transistor comprising a base, a first terminal connected to said gate, and a second terminal connected to a selected one of said anode and said cathode;
   a second transistor comprising a first terminal connected to the base of the first transistor, a second terminal, and a base connected to the gate;
   a third transistor having a first terminal connected to the first terminal of said second transistor, a second terminal connected to the other of said anode and said cathode, and a base connected to the second terminal of said second transistor;
   a resistor, having a first end connected to the second terminal of said third transistor and a second end connected to the second terminal of said second transistor and the base of said third transistor to form a common node therewith, the common node being exclusively connected to said resistor and said second and third said transistors; and
   a capacitor connected between said gate and the other of said anode and said cathode.

* * * * *